United States Patent [19]

Falkowski et al.

[11] Patent Number: 4,935,693
[45] Date of Patent: Jun. 19, 1990

[54] LINE SECURED CURRENT AND VOLTAGE SENSING APPARATUS

[75] Inventors: Paul P. Falkowski, Clearwater, Fla.; Donald W. Selby, Brentwood, Tenn.; Peter H. Forest, Oldsmar, Fla.

[73] Assignee: Square D Company, Palatine, Ill.

[21] Appl. No.: 108,389

[22] Filed: Oct. 14, 1987

[51] Int. Cl.⁵ .............................................. G01R 1/04
[52] U.S. Cl. .................................. 324/127; 324/126; 324/117 R; 336/84 C
[58] Field of Search .......... 324/126, 127, 115, 117 R; 336/84 C; 174/137, 143; 364/483

[56] References Cited

U.S. PATENT DOCUMENTS

| | | | |
|---|---|---|---|
| 2,475,230 | 7/1949 | Frey et al. | 174/169 X |
| 2,504,647 | 4/1950 | Camilli | 324/127 |
| 3,187,282 | 6/1965 | Pierce et al. | 324/126 |
| 3,251,014 | 5/1966 | Stein, Jr. | 324/127 |
| 3,363,174 | 1/1968 | Hudson et al. | 324/127 |
| 3,380,009 | 4/1968 | Miller | 336/84 C |
| 3,386,059 | 5/1968 | Stein Jr. et al. | 324/127 |
| 3,418,575 | 12/1968 | Spindle | 336/84 C |
| 3,456,222 | 7/1969 | Berg | 336/84 C X |
| 3,483,314 | 12/1969 | Harmon | 174/169 X |
| 3,770,877 | 11/1973 | Mashikian et al. | 174/143 |
| 4,307,365 | 12/1981 | Martincic | 336/96 |
| 4,413,230 | 11/1983 | Miller | 324/127 |
| 4,593,276 | 6/1986 | Aida et al. | 324/127 |
| 4,616,176 | 10/1986 | Mercure et al. | 324/127 |
| 4,621,231 | 11/1986 | Heinrich et al. | 324/127 |

FOREIGN PATENT DOCUMENTS

| | | | |
|---|---|---|---|
| 0606438 | 12/1934 | Fed. Rep. of Germany | 324/126 |
| 0153257 | 11/1981 | Japan | 324/126 |
| 842425 | 7/1958 | United Kingdom | 174/177 |

OTHER PUBLICATIONS

Anderson Electric Corporation Manufacturer's Catalog No. 57, (2nd Sec.) (Sec. B), pp. 33–B and 36–B, Oct. 1, 1957.

Primary Examiner—Reinhard J. Eisenzopf
Assistant Examiner—W. Burns
Attorney, Agent, or Firm—Michael J. Femal; Hugh M. Gilroy

[57] ABSTRACT

A combined current and voltage measuring sensor for measuring voltage and current on a primary conductor, the sensor including a cast resin body having therein an aluminum support, the support having an aluminum encasement mounted thereto. An open air coil is located in the encasement adjacent a grooved portion in the cast resin body for maintaining the primary conductor in the top of the cast resin body. The groove and the aluminum encasement cooperate to precisely located the primary conductor with respect to the open air coil. A keeper assembly mechanically maintains and locates the primary conductor in the groove and further provides an electrical connection from the primary conductor to the voltage measuring apparatus of the sensor.

30 Claims, 5 Drawing Sheets

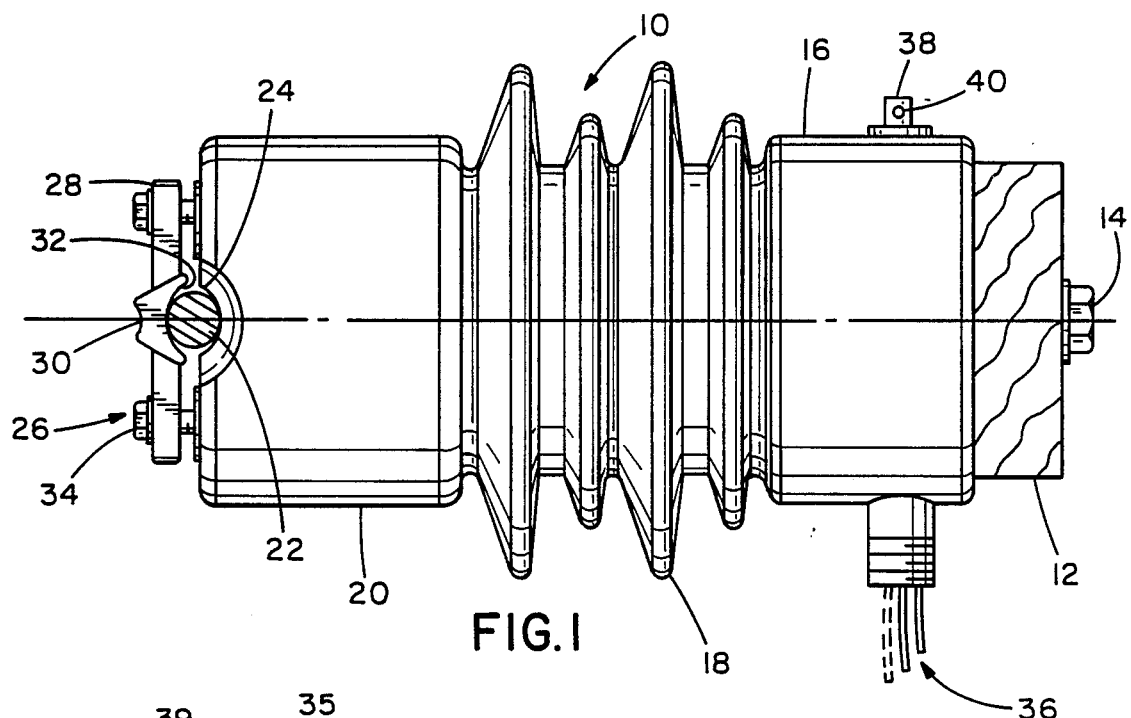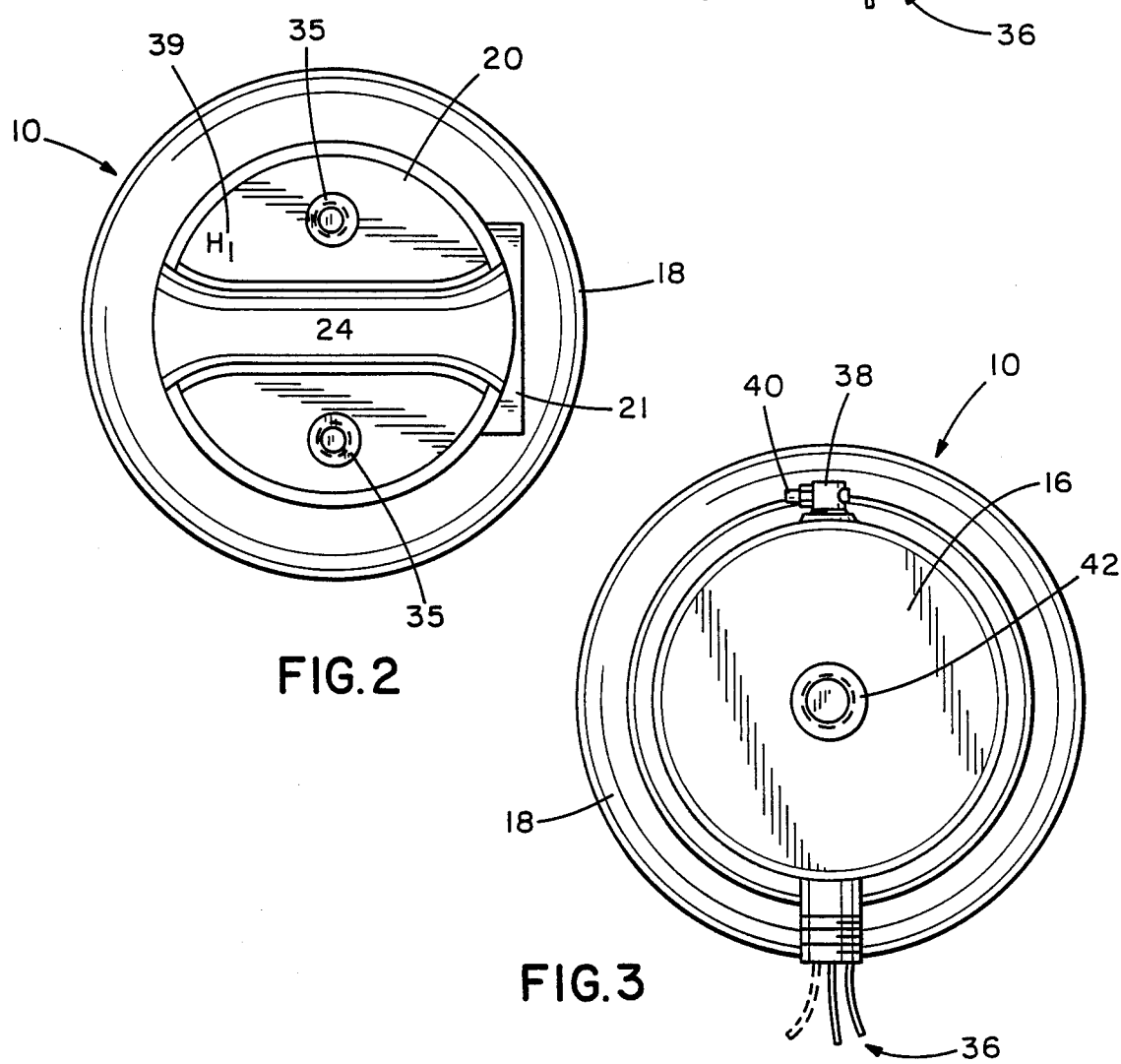

LINE SECURED CURRENT AND VOLTAGE SENSING APPARATUS

This application has common elements of the specification and drawing with application Ser. Nos. 07/108,394 and 07/108,395, filed on even date and assigned to a common applicant.

BACKGROUND OF THE INVENTION

This invention relates in general to a voltage and current sensing apparatus with a cast resin body which measures both voltage and current in a conductor in high voltage applications. In particular, the invention relates to a voltage and current sensor apparatus containing an interior coil and a non-inductive resistance voltage divider.

Current and voltage sensors are generally used by utility companies to electronically control capacitor banks, voltage regulators, reclosures, switches, electrical distribution, feeder optimization, and for conservation, load managing, and remote metering. Prior art devices, while accomplishing these feats do not produce repeatable, consistent readings. This is primarily due to the fact that most prior art devices utilize an iron core transformer coil.

Present devices for indicating or sensing voltages or currents of conductors of power lines for purposes of metering or control are relatively complex, difficult to connect with the conductors of the power line and often cannot be connected with the power line conductors unless time consuming safety procedures and safety devices are employed. With most prior art voltage and current sensing devices the power line must be disconnected so as to stop the flow of electricity therethrough and in many applications the power line must be cut to allow the insertion of the current sensing apparatus. This requires down time and loss of revenue to the utility company.

It is generally known that coil output is affected by the outside diameter of the primary cable. Prior art sensing apparatus have used charts and graphs to approximate the voltage and current sensing information developed from the iron core transformer coil. This use of charts and graphs has been cumbersome and difficult to generate or even apply with varying cable sizes. This has produced non-repeatable results with respect to voltage and current sensors. In a utility application, approximately 200 different cable sizes could be used between 0.25 inch in cable diameter through 1.25 inches cable diameter. In view of these varying cable sizes, it is difficult to generate or even apply individual correction factors to each cable size. This is particularly true where an iron core coil has been used. As the voltage and current levels increase, the iron core saturates and will not produce consistent readings. Thus, companies in the past manufacturing cable voltage and current sensors have used a graph which does not progress in a linear fashion.

A combined current and voltage measuring apparatus is shown in U.S. Pat. No. 4,074,193 to Kohler, entitled "Combined Current and Voltage Measuring Apparatus". Another voltage or current sensing apparatus is shown in U.S. Pat. No. 3,251,014 to Stein, entitled "Electrical Coupling Device". These patents are illustrative of the prior art with respect to voltage and current sensing apparatus used in high voltage applications. The patent to Kohler illustrates one version of a sensing apparatus that requires the power through the conductor to be discontinued for installation of the sensor.

Generally current and voltage sensing apparatus which do not require the disconnection of the primary conductor, such as the one shown in U.S. Pat. No. 3,251,014, to Stein, Jr. entitled "Electrical Coupling Device" utilize an iron core coil. Use of the iron core coil will produce a non-linear and generally non-repeatable response with respect to voltage or current deviations or applications and thus renders such devices relatively inaccurate for various applications. Further, the Stein, Jr., reference does not disclose any means for mechanically maintaining the conductor in the groove at the top of the casting. Thus, the Stein, Jr., reference does not teach a means by which the conductor is positioned with respect to the groove. Positioning of the conductor in a voltage and current sensing apparatus is critical for obtaining precise and repeatable readings from the sensing apparatus.

It is therefore an object of the present invention to provide a voltage and sensing apparatus which allows installation without interference with the primary conductor and without disconnecting the power supply through the conductor. Further, it is an object of the invention to provide a voltage and sensing apparatus which securely maintains the primary conductor precisely adjacent a select portion of the sensing apparatus for purposes of producing an even and measured response with respect to the metering and measuring of current and voltage.

It is another object of the present invention to provide a voltage and current sensing apparatus which produces a linear and repeatable response in all applications with respect to varying currents, voltages and conductor diameters.

It is a further object of the present invention to provide a voltage and current sensor which may replace an existing insulator on a power line and thus provide the mechanical support to the conductor which was previously supplied by the insulator. It is another object of the present invention to provide a design that can replace existing monitoring type sensing devices with considerable reduction of costs. It is another object of the present invention to provide a sensing device that can be installed without disrupting service to a customer and without modifications to the utility pole structure. It is a further object of the present invention to provide a sensor which will provide a linear output proportional to the current and voltage on the line which can then be input into a transducer to allow communication with a utility company's computer network.

SUMMARY OF THE INVENTION

The combined current and voltage sensing apparatus of the present invention realizes the above objects by including in a cast body of cycloaliphatic epoxy an air core coil spaced a select distance from a groove and connector, or keeper, assembly mounted at the top of the epoxy casting. An aluminum support and encasement surrounding the air core coil precisely locates the coil with respect to the conductor. The sensor is designed to be mounted directly to a wooden cross beam of a utility pole and to replace an existing insulator. The novel keeper or connector assembly is designed such that the primary conductor fits in the groove of the casting and then has secured thereover an aluminum keeper having a reversible groove design that allows the use of conductors ranging from 0.25 inch in diameter to 1.25 inches in diameter. By selectively spacing the air core coil from the primary conductor and by controlling the windings around the air core coil, it is possible to maintain a high degree of accuracy, on a linear basis, with respect to current variations. The air core coil has extending therefrom black and white leads, the white lead running to ground and the black lead going to output to provide the current measurement. The voltage sensor has a red lead off of the aluminum keeper assembly which is in electrical contact with the conductor. The red lead goes through a primary resistor which then goes to output. By selectively spacing the air core coil with respect to the cable, the coil output will be linear for all primary cable sizes. Further, not only will the output be linear both with increasing and decreasing primary currents, but the linear output will be repeatable. This insures a high degree of accuracy in the sensing apparatus.

In the present design, the output is linear, the correction factor is represented by a straight line that goes through zero. In view of this, an equation has been developed employing constants that relate to the physical coil dimensions and total winding turns of the coil. This equation may be used to identify any cable diameter within a range for a given coil design. The equation contains correction factors based on coil design. These correction factors would change with respect to different coil dimensions and total winding turns. However, these factors are known at the time of manufacture of the sensing apparatus and thus may be programmed into a utility company's computer system to automatically account for varying cable diameters.

An aluminum coil support is provided within the epoxy casting of the insulator. The coil support is comprised of an aluminum circular support extending from the base of the sensor to a select distance from the top of the sensor apparatus. Mounted to the aluminum shaft is an aluminum rectangular encasement which is designed to encase the open air coil. The support is mounted directly to the wooden cross beam by means of a mounting bolt such that the epoxy insulator surrounding the shaft is free to "float" to a limited extent. This accounts for the differing coefficients of expansion between the aluminum material and the epoxy. By mounting and securing the aluminum support casting in this novel manner, a means for preventing cracking of the epoxy due to weather and thermal changes is provided.

In the present invention, all electrical sensing elements are sealed in a homogeneous casting of cycloaliphatic epoxy insulator configuration. The skirt portion provides the appearance of an insulator and the general mechanical support structure of an insulator for which the current and voltage sensor is intended to replace. Due to the novel mounting of the coil support casting, weather resistant life is provided in outdoor applications. In addition, no maintenance is required once the unit is installed. The keeper design comprises an aluminum keeper with stainless steel bolts. The voltage and current sensor is intended to be manufactured for use in standard 15 kilovolt, 25 kilovolt, or 38 kilovolt sizes and will give a linear output voltage proportional to current flow in the source conductor.

In an alternative embodiment, if higher accuracy is desired, a variable output shaping resistor can be added between the black and white leads of the air core transformer. This will increase accuracy but may not be necessary depending on the accuracy of the windings of the air coil.

BRIEF DESCRIPTION OF THE DRAWINGS

The features of the present invention which are believed to be novel are set forth with particularity in the appended claims. The invention together with further objects and advantages thereof may best be understood by reference to the following description, taken in conjunction with the accompanying drawings in the several figures of which like reference numerals identify like elements, and in which:

FIG. 1 is a side view of the voltage and current sensor shown mounted to a wooden cross beam and having a primary conductor connected thereto.

FIG. 2 is a top view of the voltage and current sensor having the primary conductor and keeper assembly removed therefrom.

FIG. 3 is a bottom view of the voltage and current sensor without its being mounted to the wooden cross beam.

DETAILED DESCRIPTION

Figure 4:
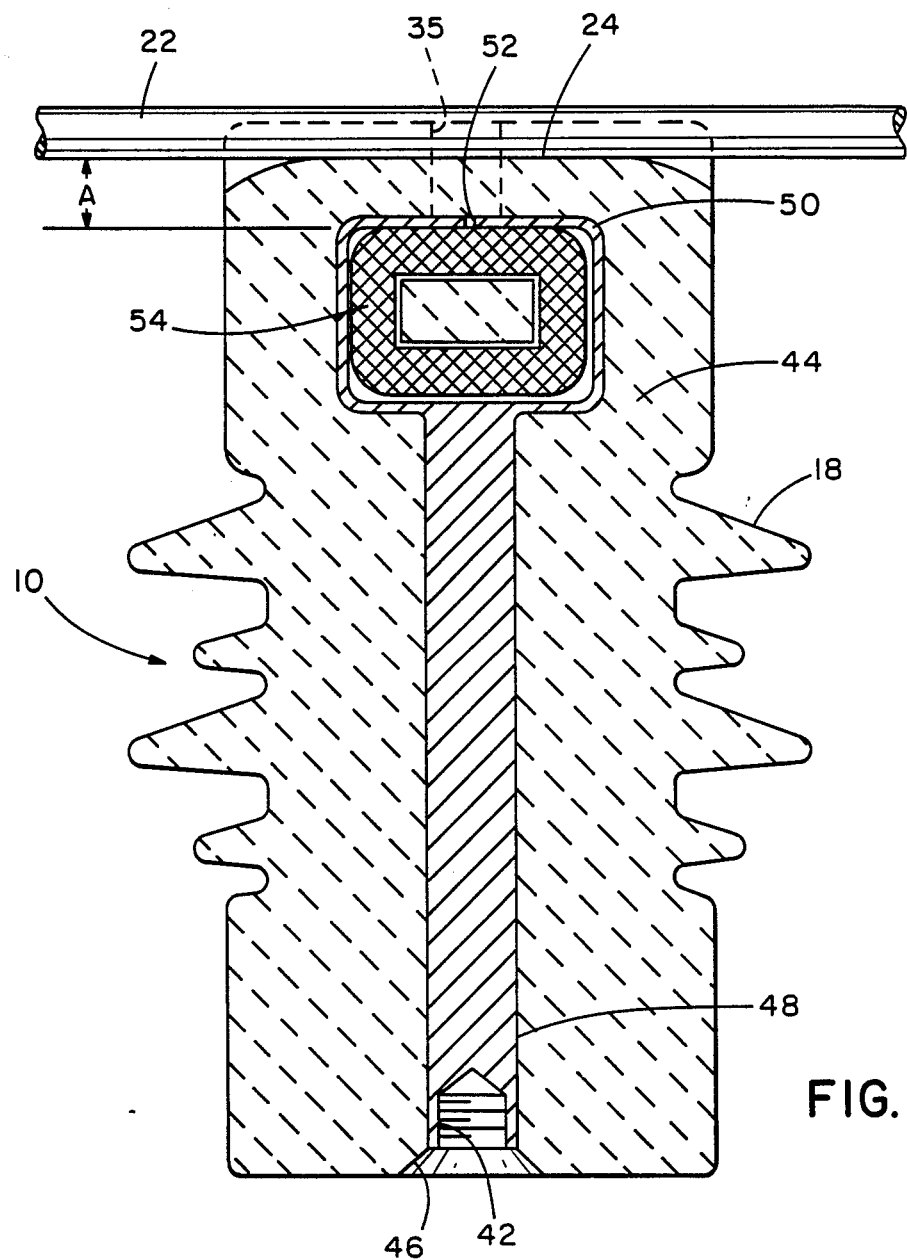
FIG. 4 is a side section view of the voltage and current sensor showing the placement of the air coil with respect to the groove of the keeper assembly.

This invention relates to an apparatus for current and voltage sensing in a primary conductor primarily for use in utility environment. FIG. 1 of the drawings shows the voltage and current sensor 10 in side view attached to wooden cross beam 12. Wooden cross beam 12 is intended to reflect the cross beam of a utility pole application for which voltage and current sensor 10 would serve to replace an existing insulator (not shown). The insulator is generally of a design similar to that of the voltage and current sensor 10 as far as the shape and configuration goes. Thus, mounting the voltage and current sensor 10 in place of the standard type insulator on wooden cross beam 12 would not pose any significant structural changes with respect to the utility pole and the primary conductor. Mounting bolt 14 serves to connect the voltage and current sensor 10 to the wooden cross beam 12 such that there is a mechanical and secure connection therewith.

Voltage and current sensor 10 has base 16 out of which projects output conductors 36 at one end and, at a distal end, projects ground cap 38 and ground wire 40. Connected to base 16 are skirts 18 and formed adjacent thereto is top 20. Top portion 20 has groove 24 therein which secures the primary conductor 22. Primary conductor 22 is held in groove 24 by keeper assembly 26. Keeper assembly 26 has flat section 28, small groove 30, and opposite therefrom large groove 32. In FIG. 1 the conductor 22 shown is of a large diameter type conductor which is used with large groove 32. Keeper assembly 26 is reversible in that with a small diameter conductor small groove 30 could be used simply by reversing the keeper assembly and securing it to the top section 20 of sensor 10 by virtue of stainless steel bolts 34. FIG. 5a illustrates such an application.

FIG. 2 illustrates the top portion of the sensor 10 without the keeper assembly 26 installed. Also, FIG. 2 illustrates the sensor 10 without the conductor 22 in groove 24. Threaded openings 35 are shown in top section 20 of sensor 10 for the purpose of receiving bolts 34 of the keeper assembly 26. Groove 24 precisely locates the conductor 22 within the top section 20 of sensor 10. Groove 24 in one embodiment has a radius of ⅜ inches, which will allow it to accommodate up to a 1.25 inch diameter primary conductor.

FIG. 3 illustrates the bottom view of the sensor 10 without the wooden cross beam 12 and mounting bolt 14. On the base 16 of sensor 10, opening 42 is shown for receiving the threaded mounting bolt 14. Also, the relationship of ground terminal 38 and ground wire 40 is shown.

FIG. 4 illustrates a section view of sensor 10 and in particular illustrates the relationship of the interior air core coil 54 with respect to groove 24. As can be appreciated, this relationship is critical in obtaining precise, repeatable linear readings by the sensor 10. Aluminum shaft 48 is mounted within the cast resin epoxy material 44 of the sensor. Aluminum encasement 50 is integrally connected with the aluminum support 48 for encasing the open air coil 54. Aluminum support 48 also serves to precisely locate the position of the air core coil 54 with respect to groove 24 to further ensure the accuracy of the unit. Countersink portion 46 is shown in FIG. 4 in the cast resin epoxy 44 portion of the sensor 10. This countersink serves two functions. First, it allows the easy location of the bolt 14 for threading with opening 42. Second, and more importantly, it allows for the thermal expansion and contraction of the epoxy material 44 and aluminum support 48 with respect to each other in varying temperatures when used in outdoor applications. It should be noted that the co-efficient of expansion for aluminum is different than for the cycloaliphatic epoxy used in the present design. To fail to allow for a means by which the aluminum can expand and contract with respect to the epoxy would cause the epoxy casting to crack. The structural capability of the sensor 10 to mechanically maintain the conductor 22 with respect to the wooden cross beam 12, or other structural member, would be severely hampered. Since the aluminum support 48 has no cross beams attached to it, the epoxy and aluminum are free to move somewhat independently. Thus, the aluminum support 48 and aluminum encasement 50 design shown in FIG. 4 provide a means by which the air core coil 54 can be precisely placed with respect to groove 24 in a continuous manufacturing process as well as providing a means by which the outdoor application of the sensor 10 can allow for the co-efficient of expansion of different types of materials.

Figure 5:
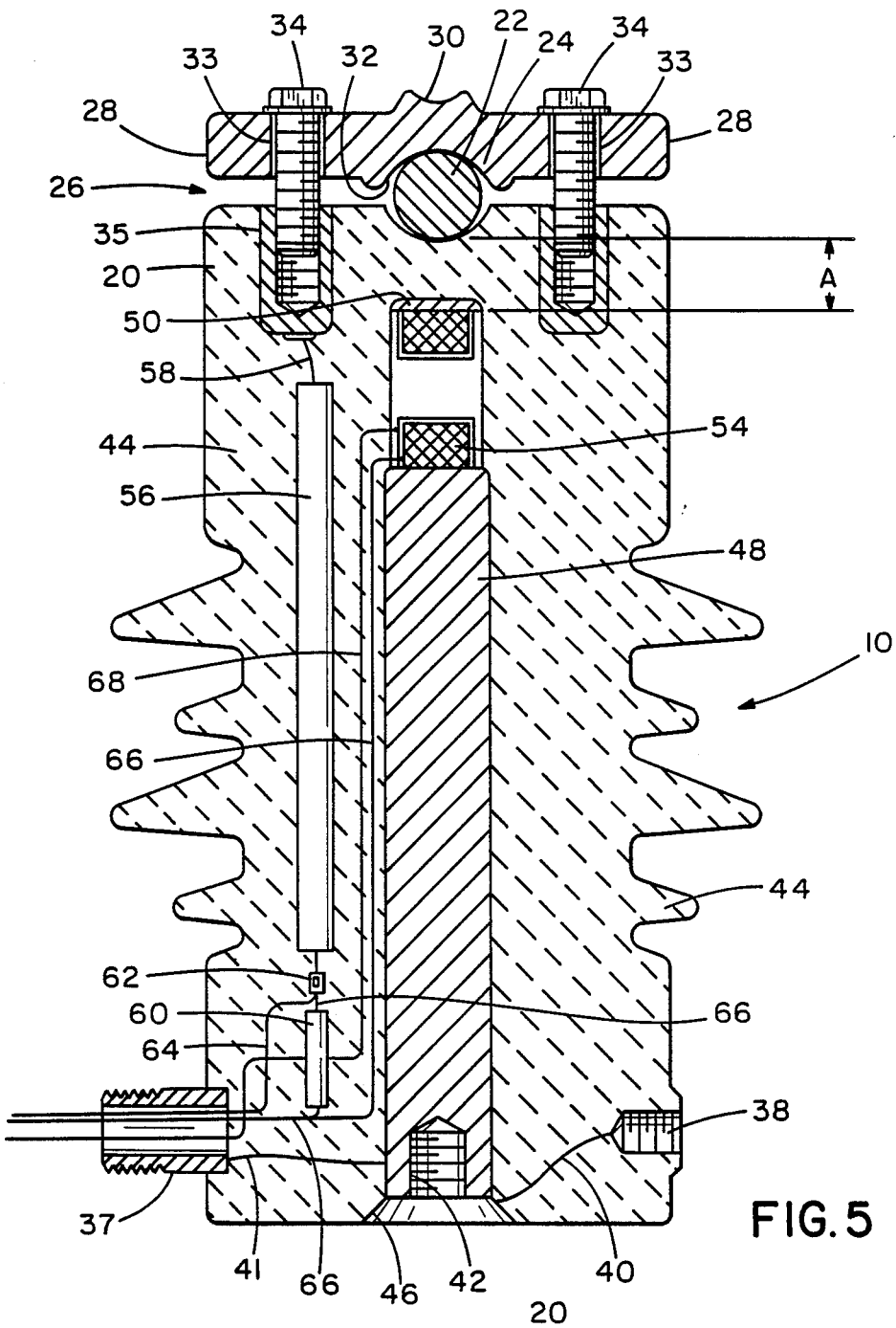
FIG. 5 is a side section view of the voltage and current sensor showing the relationship of the resistive elements as well as the conductors with respect to the primary conductor.
Figure 5A:
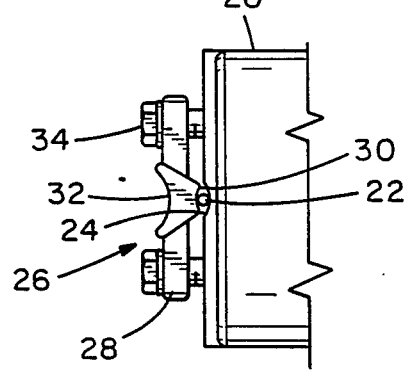
FIG. 5A is a side view of the keeper assembly used with a primary conductor of a relatively small diameter.

FIG. 5 illustrates the sensor 10 with the various internal components comprising the voltage and current sensor assembly shown therein. It will be noticed that the keeper assembly 26 is shown connected to the top portion 20 of sensor 10 by means of bolts 34 which pass through unthreaded openings 33 in the flat portion 28 of keeper assembly 26. Bolts 34 are threaded into threaded openings 35 formed directly in the epoxy 44 which comprises the insulation portion of sensor 10. As shown in FIGS. 1 and 5, primary conductor 22 is of a larger diameter which requires the use of groove 32 on keeper assembly 26 rather than smaller groove 30. The keeper assembly as shown in FIGS. 10 through 13 is reversible and due to the curvature precisely locates the conductor 22 within groove 24. Proper location of conductor 22 within groove 24 is essential for the accurate functioning of the sensor 10.

In a sensor of an air core design of the present invention, the distance between the conductor 22 and the air coil 54 is critical. In order to obtain precise and repeatable readings regarding voltage and current in the primary conductor 22, this distance, shown as "A" in FIG. 5, must be precisely located. In one embodiment, it was found that a distance A of 0.904 inch is appropriate for use of the sensor in voltage classes up to and including 38 KV.

FIG. 5 illustrates the voltage sensing apparatus of the sensor 10 with connecting wire 58 taken from bolt 34 and going to the high voltage primary resistor 56 which, in one embodiment, would be a 200 megaohm resistor. This would be for a 15 KV application. A split connection at 62 comes out of the high voltage resistor 56 and splits off of red lead 64 which goes directly to the output to measure the voltage in the primary conductor 22. White lead 65 goes directly to the low voltage secondary resistor 60 which comprises a 20K ohm resistor in an embodiment for a 15 KV application. In a 25 KV application, the primary resistor would comprise two 200 megaohm resistors in series and the secondary resistor would comprise two 20K ohm resistors in series. In a 38 KV application, the primary resistor would comprise three 400 megaohm resistors in series and one 120K ohm resistor.

The current sensing portion of the sensor apparatus 10 comprises the air core coil 54 having black output lead 68 running therefrom to the output through the output wire tube 37. The white output ground lead 66 runs from open air coil 54 to connect with the low voltage secondary resistor 60 which again, in a 15 KV application, would be a 20K ohm resistor. This white ground lead 66 then also projects outwardly of the output tube 37. Ground wires 40 and 41 project from support 48 to ground tube 38 and output tube 37. This grounds the aluminum support 48 and encasement 50. The black output lead 68 would, in one application, go to a programmable controller (not shown) programmed to sense phase angle and the differential of the power factor.

It should be noted that the positioning of the coil in encasement 50 is such that the axis of the coil is normal to the axis of the conductor 22.

FIG. 5A illustrates the use of the keeper assembly 26 with a small diameter conductor 22. It should be noted that small groove 30 is now shown adjacent small conductor 22 and is used to locate the small diameter conductor 22 with respect to groove 24 of top section 20 of the current sensor 10.

Figure 6:
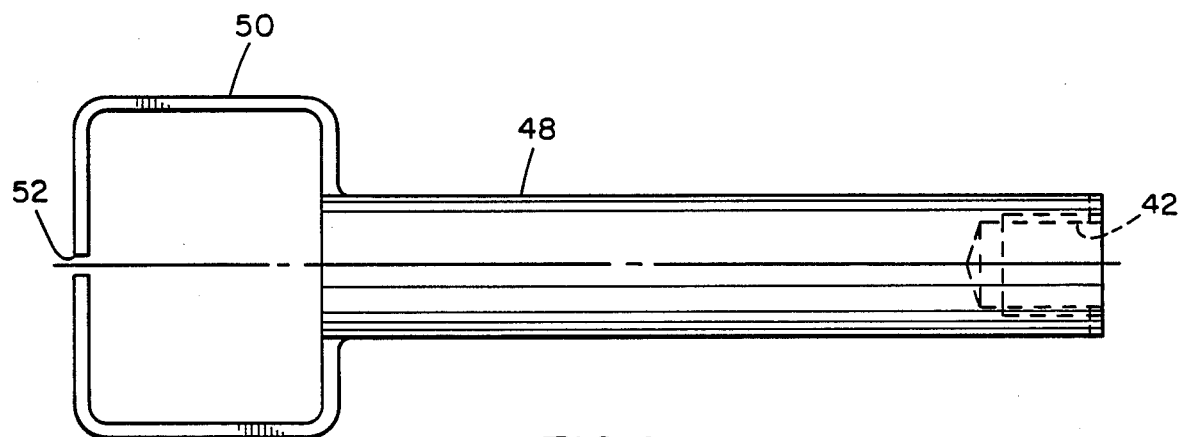
FIG. 6 is a side view of the aluminum shaft and encasement.
Figure 7:
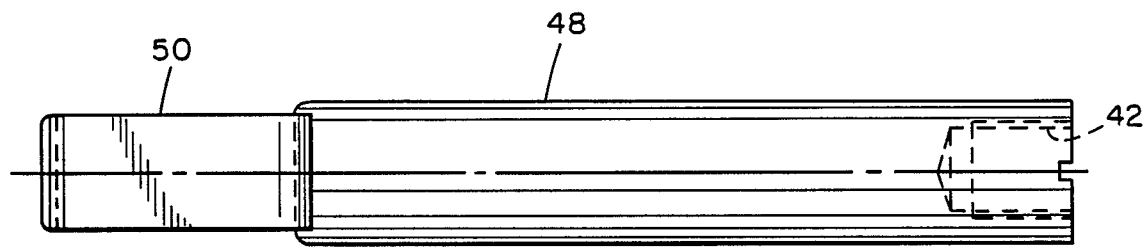
FIG. 7 is a end view of the aluminum shaft and encasement.

FIGS. 6 and 7 show in greater detail the support 48 and its connection with the aluminum encasement 50. Slot 52 is provided at the end of encasement 50 for the purpose of preventing the encasement from becoming a shorted turn as well as improving the overall accuracy of the unit.

Figure 8:
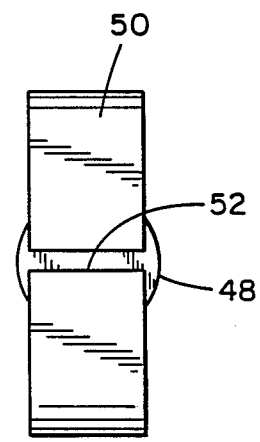
FIG. 8 is a top view of the aluminum shaft and encasement.
Figure 9:
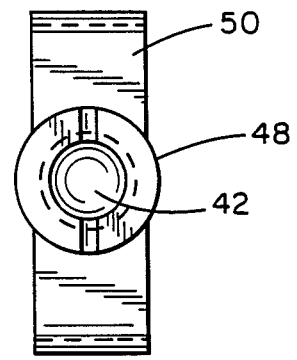
FIG. 9 is a bottom view of the aluminum shaft and encasement.

The aluminum encasement 50 is an aluminum housing intended to provide a dielectric shield in case of lightning strike or insulation failure due to some other high voltage or transient phenomenon. The encasement 50 will help keep high voltage out of the secondary circuit by directing the high voltage directly to ground through ground wires 41 and 40 shown in FIG. 5. The casting shown in FIGS. 6 and 7 is manufactured to be homogenous and free of voids and crystallization. It should be noted that there are no sharp edges on either encasement 50 or support 48 for the purpose of reducing the onset of corona and other such electrical phenomenon. FIGS. 8 and 9 illustrate a top and bottom view, respectively, of the aluminum support 48 and encasement 50. FIG. 8 illustrates the relationship of the slot 52 with respect to the encasement 50. It should be noted that this slot is intended as a minimum width slot having a width sufficient to prevent the shield from becoming a shorted turn. FIG. 9 illustrates the bottom view of the aluminum support 48 having threaded opening 42 therein for the purpose of receiving mounting bolt 14.

Figure 10:
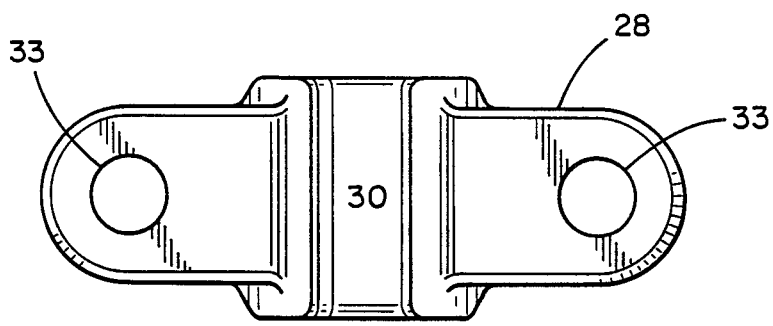
FIG. 10 is a top view of the keeper assembly.
Figure 11:
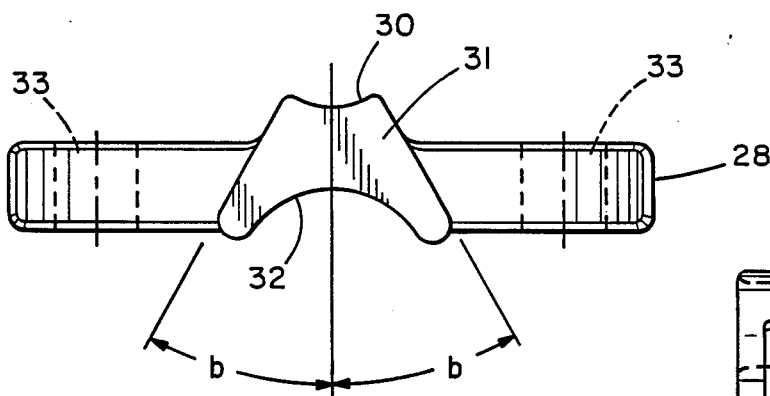
FIG. 11 is a side view of the keeper assembly.
Figure 12:
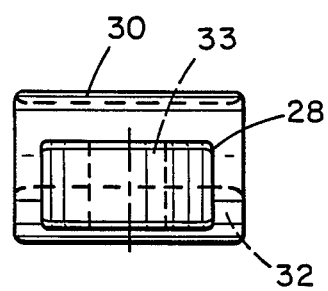
FIG. 12 is an end view of the keeper assembly.
Figure 13:
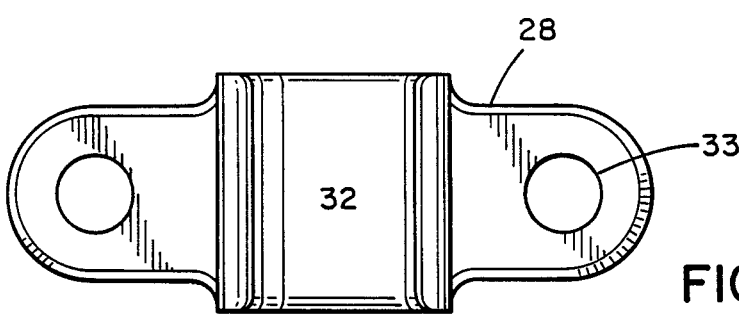
FIG. 13 is a bottom view of the keeper assembly.

FIGS. 10-13 illustrate the keeper assembly 26 without the mounting bolts and show that the assembly 26 comprises flat portions 28 having unthreaded openings 33 at opposite ends thereof. FIG. 10 shows the top view of the keeper and shows small groove 30 which is intended for a small diameter conductor application. FIG. 11 illustrates in side view the keeper assembly and illustrates its reversible nature in that both groove 32 and groove 30 are shown. FIG. 12 illustrates the end view of keeper assembly 26 and in dotted line the relationship of the depth of groove 30 with respect to the depth of groove 32. FIG. 13 illustrates the large groove 32 in a bottom view.

By indicating the polarity as an additional feature of the device, the air core coil can detect the direction of current flow in the primary conductor. This can be useful in indicating a reverse power flow situation. When using the sensor in different power applications such as with a 38 KV class application, it is anticipated that the length of the sensor from the base 16 to the top 20 would be 17.97 inches. However, when used with a 25 KV application, the length from the bottom of the base 16 to the top 20 of the sensor 10 would be 14 inches. When used with a 15 KV voltage class, the length from the base 16 of the sensor to the top portion 20 of the sensor is anticipated at 10 inches. This dimension, as well as the dimensions cited for the 38 KV class and 25 KV class are consistent with current insulator sizes which the voltage and current sensor 10 are intended to replace as a structural member. Of course, it must be realized that in differing voltage classifications the length of the aluminum support 48 will vary to maintain the proper location and placement of the encasement 50 which maintains the air coil 54 from groove 24 located in the top 20 of sensor 10. For use in a 15 KV application the overall length of the support 48 and the encasement 50 would be 8.84 inches, whereas in the 25 KV application the overall length would be 12.81 inches and in the 38 KV application the length would be 16.78 inches. This maintains an ease of manufacture since the sensing coils 54 remain the same for all voltage classes. Thus, with a minimum change in parts, the sensor is able to accommodate varying voltage classes in utility applications.

With respect to the keeper assembly 26, it is intended that it would be manufactured of a casting of 356-T6 aluminum with stainless steel mounting bolts 34 used in conjunction therewith. Thus, the clamp assembly 26 which includes the flat section 28, as well as the grooves 30 and 32 and bolts 34, is non-magnetic so as to not interfere with the coil output accuracy. In one application the mounting bolts 34 would comprise a $\frac{1}{2}-13 \times 2.00$ LG stainless steel bolt used in connection with a $\frac{1}{2}$ stainless steel lock washer. The sensor 10 having skirt 18 would have in a bottom view such as in FIG. 3 a radius measured from the center of opening 42 to the outermost portion of the skirt 18 of 3.62 inches. Opening 42 would accomodate a $\frac{3}{4}$ inch utility standard bolt with a 0.781-10 tap to allow for a galvanized bolt. Additional inserts can be added on the base 16 of sensor 10 to provide further support to a structural member if required in a particular application; however, it should be noted that by adding the additional inserts, the difficulties with the varying co-efficients of expansion between the aluminum and the cycloaliphatic epoxy would have to be considered and proper adjustments made.

The keeper assembly 26 includes a width of 2.82 inches and is intended to receive a torque value for the bolts of 32 foot-pounds. From the center points of openings 33 across the length of keeper assembly 26, the distance is 3 inches. Threaded openings 35 drilled into top section 20 of sensor 10 are 1.12 inches of threaded depth. From the center point of either groove 30 or 32 to the outermost curve of flat section 28, the distance measures 2.06 inches in one embodiment. Small groove 30 has a 0.34 inch radius whereas large groove 32 has a 0.59 inch radius. The keeper assembly is entirely rounded at all ends to further reduce the effects of corona. The flat sections have a depth of 0.56 inch and openings 33 have a diameter of 0.56 inch each. The angle of central section 31 shown in FIG. 11 as angle b is 36 degrees, which is important when the grooves 30 or 32 are placed over a conductor 22 and bolts 34 are torqued through openings 33 at the 32 foot-pound rating. This angulation in combination with the radius of the grooves 30 and 32 provides a flexing of the keeper assembly which maintains the conductor 22 in a precise location in groove 24 of top section 20 of sensor 10. Groove 24 has a radius of 0.62 inch. Again, placement of the conductor and maintenance of the conductor in the precise location of groove 24 is essential to accurate and reliable operation of the voltage and current sensor 10.

With respect to the design of the voltage and current sensor 10, it should be noted that the coil output is linear for all primary conductor 22 sizes. It is intended that with a specific coil winding the sizes of conductor 22 could vary between 0.25 inch outside diameter to 1.25 inches outside diameter which would include approximately 200 different cable sizes. As with prior art devices, it was very difficult to generate or even apply individual correction factors for each cable size. However, in view of the linear feature of the present design, i.e. that the coil output is linear, the correction factors for various size conductors 22 would be represented by a straight line on a graph that would go through zero. Thus, it is possible to develop an equation to identify any line within the family for a given coil design. A typical equation is: $i_p = e_s((K_1 \times O.D.) + K_2)$.

With respect to the above equation, $i_p$ represents the primary conductor current to be measured, $e_s$ represents the sensor coil output in volts, the O.D. represents the primary conductor outside diameter. $K_1$ and $K_2$ are design constants which are determined by the physical coil dimensions and total turns of the coil. One coil design, allows for usage of the equation as follows: $i_p = e_s((23.8 \times O.D.) + 78.5)$. In the above equations, 23.8 and 78.5 represent the design constants K1 and K2 and relate to a particular physical coil size. It should be noted that with the proposed design, increasing and decreasing primary currents will produce a linear output. Also, the linear output is repeatable, meaning that similar readings will be received on repeat testings. Further, this means that individual units will read consistently with each other from a manufacturing standpoint so long as they are made to the precise tolerances prescribed by the manufacturing drawings.

Figure 14:
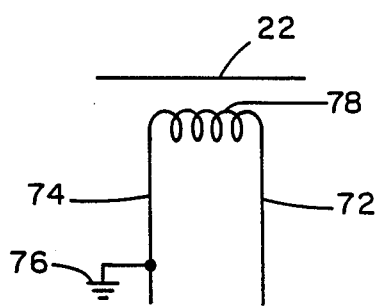
FIG. 14 is a circuit schematic of the current sensing portion of the voltage and current sensor.

FIG. 14 illustrates the current sensor schematic for the electrical circuitry of the current sensing portion of the apparatus. As can be seen in FIG. 14, primary conductor 22 passes in near proximity to the linear coupler 78, which in the present embodiment would comprise the air core coil 54. Black lead 72 is taken from the linear coupler 78 and runs to output. White lead 74 comes from the other end of the linear coupler 78 and connects to ground 76. It is important to keep in mind that one of the main features of the present invention is the fact that the primary conductor 22 is kept a predetermined distance from coupler 78 by virtue of the aluminum support and encasement apparatus embodied in the epoxy casting of the voltage and current sensor 10.

Figure 15:
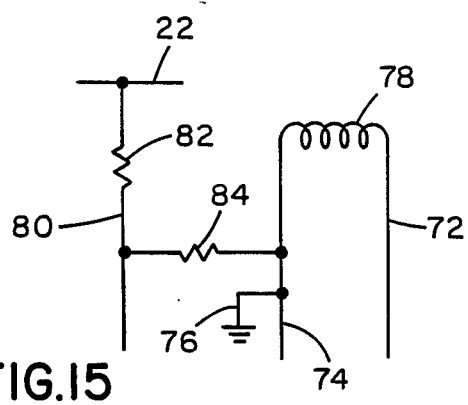
FIG. 15 is a schematic of the voltage and current sensing apparatus for the voltage and current sensor.

FIG. 15 illustrates the voltage and current sensor as combined in the present invention. As can be seen, a low voltage resistor 84 is connected between white lead 74 and red lead 80. Red lead 80 connects to a high voltage resistor 82 and then connects to the primary conductor 22. In this manner, a voltage and current sensing apparatus is provided, as previously described in the present invention.

Figure 16:
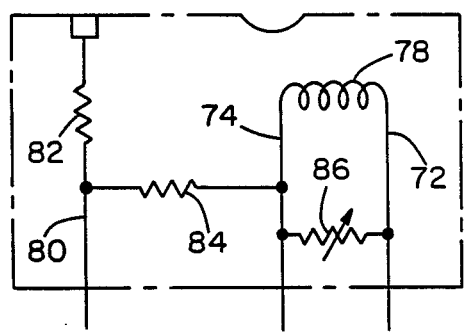
FIG. 16 is a schematic of an alternative embodiment showing the voltage and current sensing diagrams with a variable resistor added.

FIG. 16 illustrates an alternative embodiment of the present invention in which a variable compensating resistor 86 is added between black output lead 72 and white output lead 74. This variable compensating resistor would be provided in instances where extreme accuracy is required. The resistor is then tuned to provide extremely high accuracy readings for the apparatus. It is anticipated, however, that if the coil 54 windings are precisely and carefully wound, in most applications, the variable compensating resistor will not be needed.

The foregoing invention is not limited to the particular details of construction of the device depicted, and other modifications and applications are contemplated. Certain other changes may be made in the above described device without departing from the true spirit and scope of the invention here involved. It is intended, therefore, that the subject matter in the above description shall be interpreted as illustrative and not in a limiting sense.

We claim:

1. An apparatus for sensing voltage and current in a primary conductor comprising a body, said body having a top side and a bottom side; an elongated shaft formed in said bottom side and extending towards the top side a select distance, a groove formed on said top side, said elongated shaft having mounted therein an elongated support, said support having a top end and a bottom end, said support top end having an encasement formed thereon and said support bottom end having a threaded opening therein for mounting to a power line support structure; an air core electrical coil mounted in said encasement and said encasement containing said coil and placed in said shaft a select distance from the groove in the top side of the body; current output leads connected to the coil, one of said leads going to ground and the other of said leads providing a current signal; means for mechanically releasably securing the primary conductor in the groove in the top side of the body, said securement means forming an electrical connection with said primary conductor and a voltage output lead connected to the securement means, said voltage output lead connected to a high voltage resistor, a low voltage resistor connected to said high voltage resistor, a signal lead connected to the junction between said high voltage resistor and said low voltage resistor conducting a voltage signal proportional to the voltage of the primary conductor.

2. The apparatus of claim 1 where the body comprises a cast resin epoxy.

3. The apparatus of claim 1 where the axis of the electrical coil is normal to the axis of the primary conductor, such that the flow of electricity through the primary conductor causes a magnetic response in the coil and creates a flow of current in the current output leads connected to the coil.

4. The apparatus of claim 1 where the elongated support comprises a cylindrical member having secured at one end of said member said encasement, said encasement encasing the electrical coil in substantially one plane, said encasement comprising a strap surrounding the coil in a single plane and having substantially the same shape as the coil.

5. The apparatus of claim 4 where the cylindrical member and the strap are aluminum.

6. The apparatus of claim 1 where the securement means comprises a metallic connector assembly, said connector assembly comprising a central section having opposing flat sections extending therefrom, each said flat section having an opening therein for securing said connector assembly to the body by means of a pair of threaded bolts, each bolt receivable in said opening and matable with a like threaded metallic insert in said body, said central section having a groove therein corresponding to said groove in said top section such that when the primary conductor is placed in the groove in the top section and the groove of the central section is secured over the primary conductor with said bolts, a secure mechanical and electrical connection is formed.

7. The apparatus of claim 6 where said connector assembly, metallic insert and threaded bolts comprise stainless steel.

8. The apparatus of claim 6 where said threaded metallic insert in said cast resin body has therein said voltage output lead such that said threaded bolt, when threaded in said insert and securing said primary conductor between said top section groove and said connector groove, makes electrical contact with said primary conductor.

9. A voltage and current transducer standoff for supporting a power line conductor and measuring the potential of the conductor and the current conducted by the conductor, said standoff comprising:

an elongate support having a support axis extending between a support top and a support bottom, said support having support sides which are regularly spaced from said support axis;

a coil having a coil axis about which turns of the coil are wound being exposed to the magnetic flux caused by the current of the conductor;

a toroidal coil encasement affixed to the support top surrounding said coil turns with said coil axis aligned to pass through an orifice defined by the toroidal coil encasement, said encasement fixing said coil to said support top and having a coil encasement side which is spaced further from a line established by said support axis than said support sides;

an elongate body fabricated from insulative epoxy resin, said body having a body top, and a body bottom and a central axis, about which body sides are generally symmetrical, extending between the body top and body bottom, said body sides including skirts extending beyond the mean width of the body and side grooves which do not extend to the mean width of said body, said body completely surrounding said coil encasement and slidably surrounding said support from the support top to very near said support bottom, but not covering a substantial portion of said support bottom, so that said support may slide relative to said body without inducing major stresses in said body, said body further defining a body groove in the body top a select distance above said coil encasement;

conductive conductor restraining means for securing conductors within said body groove, said restraining means being exposed to the electromagnetic field caused by the potential of said conductor;

current output leads operatively connected to the coil embedded in said body for their greater portion, said coil leads conducting the signal induced in said coil by said magnetic flux outside said body; and a voltage output lead operatively connected to said conductive conductor restraining means conducting a signal induced in said restraining means by said conductor potential.

10. The transducer of claim 9 wherein:
said conductor restraining means secures a given conductor within a small range of sizes in a small orientation and secures a given conductor within a large range of sizes in a large orientation.

11. The transducer of claim 10 wherein:
said conductor restraining means is not magnetic and further includes
a keeper defining a large groove to an upper side and a small groove to a lower side near the median region of said keeper, said keeper further defining at least one bolt orifice at one end of said keeper;
a threaded bolt inserted through said bolt orifice; and
a threaded insert received in said body threadably securing said bolt to said insert and thereby removably securing said conductor restraining means to said body.

12. The transducer of claim 9 wherein:
said coil encasement and said support are conductive, but not magnetic, and are electrically connected to each other; and further including
a grounding lead operatively connected to said coil encasement and said support, embedded in said body for the greater length of said lead, providing a conductive path to ground potential.

13. The transducer of claim 12 wherein one of said current output leads is connected to said grounding lead.

14. The transducer of claim 13 wherein said voltage output lead includes a dropping resistor.

15. The transducer of claim 14 further including:
a grounding resistor connected at a dropping end to said dropping resistor at the connection of said dropping resistor opposite the connection of said dropping resistor to said coil, and said grounding resistor connected to said grounding lead at a grounding end.

16. The transducer of claim 9 wherein said support sides do not increase in distance from said support axis in moving upward from said support bottom to said support top.

17. The transducer of claim 9 wherein said support sides are parallel to said support axis.

18. The transducer of claim 17 wherein said support is a cylinder; and said coil encasement is strap-like and wrapped about said coil.

19. The transducer of claim 9 wherein said toroidal coil encasement has a perimeter interrupted by a slot.

20. The transducer of claim 17 wherein said toroidal coil encasement has a perimeter interrupted by a slot.

21. The transducer of claim 18 wherein said strap is interrupted by a slot transverse to a greatest strap extension.

22. The apparatus of claim 4 wherein said strap is discontinuous and forms at least one gap between strap segments.

23. The apparatus of claim 9 where the conductor restraining means comprises a stainless steel bar having a groove therein for receiving the primary conductor and openings therein, each said opening having a threaded bolt therein, each said threaded bolt received in a like threaded opening in said body such that the primary conductor is secured between the stainless steel bar and the body at a select location on said body groove.

24. The apparatus of claim 9 where the support has means for mounting to a power line support structure therein, said mounting means comprising a threaded opening in the support, said threaded opening able to receive a like threaded bolt therein, said bolt securing said support to said power line support structure.

25. The apparatus of claim 9 where the body comprises cycloaliphatic epoxy.

26. An apparatus for sensing current in a conductor, said apparatus comprising
a body made of electrical insulating material, said body having means for precisely locating and maintaining the conductor adjacent hereto,
means for sensing the current in the conductor, said current sensing means comprising an air core electrical coil positioned within said body a select distance from the primary conductor, said air core coil having two output leads connected thereto, one of said output leads going to a ground connection, and the other of said leads going to an output connection, said output connection being adapted to be connected to means for reading the current in the conductor such that as a current flows in the conductor, a magnetic flux is created around the coil and produces a current in said leads, said current in said leads being proportional to the current in the conductor and determined by the construction of the electrical coil, and an encasement within said body, spaced from and electrically insulated from the conductor by said body, and made of conductive material, said encasement supporting said air coil and partially surrounding said air coil and being between said air coil and the conductor, said encasement being generally open on opposite sides thereof.

27. The apparatus of claim 26 where the coil is positioned within the body by an elongated support housed within said body, said support having formed thereon at one end said encasement, and wherein said body is made of epoxy, and wherein said support is generally smooth so that said epoxy body can expand relative to said support.

28. The apparatus of claim 27 where the support and encasement are aluminum.

29. The apparatus of claim 26 where the body comprises a cycloaliphatic epoxy.

30. The apparatus of claim 28 wherein said encasement is discontinuous and a gap is formed between encasement segments.

* * * * *